(12) United States Patent
Sakuno

(10) Patent No.: US 6,433,641 B1
(45) Date of Patent: Aug. 13, 2002

(54) POWER AMPLIFIER AND COMMUNICATION DEVICE INCLUDING POWER AMPLIFIER

(75) Inventor: Keiichi Sakuno, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/618,448

(22) Filed: Jul. 18, 2000

(30) Foreign Application Priority Data

Jul. 19, 1999 (JP) .............................. 11-204484
Jul. 5, 2000 (JP) ........................ 2000-203516

(51) Int. Cl.[7] .................................. H03F 3/04
(52) U.S. Cl. ........................ 330/296; 330/149
(58) Field of Search ................ 330/149, 296, 330/285

(56) References Cited

U.S. PATENT DOCUMENTS 3,984,783 A * 10/1976 Bickley ...................... 330/296
5,241,284 A * 8/1993 Nyqvist et al. .............. 330/297
5,363,058 A * 11/1994 Sasaki ........................ 330/136
5,675,290 A * 10/1997 Tsukahara et al. .......... 330/296
5,710,523 A * 1/1998 Kobayashi .................. 330/300
5,760,651 A * 6/1998 Wong ......................... 330/296
5,814,038 A * 9/1998 Ogura et al. ................ 330/149
6,262,631 B1 * 7/2001 Li .............................. 330/149

FOREIGN PATENT DOCUMENTS

JP    A9260964    10/1997

* cited by examiner

Primary Examiner—Robert Pascal
Assistant Examiner—Khanh Van Nguyen

(57) ABSTRACT

A resistor and a capacitor are provided for a variable impedance element which performs distortion compensation of a power amplifier. Thus, compensation of amplitude-amplitude distortion and amplitude-phase distortion can be separately adjusted. As a result, distortion of the power amplifier can be reduced effectively and a highly efficient operation is made possible.

19 Claims, 13 Drawing Sheets

POWER AMPLIFIER AND COMMUNICATION DEVICE INCLUDING POWER AMPLIFIER

BACKGROUND OF THE INVENTION

1. Field of the Invention

The present invention relates to power amplifiers and communication devices. More particularly, the present invention relates to a power amplifier for transmission which is used in a radio communication device or the like requiring amplification with low distortion, and a communication device which includes the power amplifier.

2. Description of the Background Art

As in mobile communication systems for mobile phones or the like, radio communication systems using quasi-microwave and microwave bands have rapidly spread in recent years. That greatly contributes to attaining portable terminals of lighter weight and lower power consumption.

In order to achieve lighter weight of portable terminals, it is effective to use lighter batteries of a small capacity type. However, employment of the small capacity type generally shortens the time till the battery runs out. Therefore, lower power consumption, that is, improvement in the power efficiency is strongly required for power amplifiers for transmission which lead to most power consumption of terminals at the time of transmission.

In constant amplitude analog modulation/demodulation systems using conventional FM modulation/demodulation methods, power amplifiers can operate in a saturated state and thus they can be made more efficient relatively easily. Recently, however, communication systems which employ digital modulation/demodulation using QPSK (quadrature phase shift keying) modulation or the like with high frequency utilization efficiency have become the mainstream.

In the digital modulation/demodulation methods, information is transmitted by both the amplitudes and phases of signals, and thus power amplifiers are required to linearly amplify input signals. Generally, as an increase in output power due to the increased input power approaches saturation, the power amplifiers come to have higher distortion and power efficiency. Therefore, high power efficiency and low distortion are in a tradeoff relationship. Attempts to improve the power efficiency are often made by adding a distortion compensation circuit so that the operation is performed with low distortion even at high input power. One example is described in Japanese Patent Laying-Open No. 9-260964 entitled "High Frequency Amplification Circuit" (hereinafter, referred to as Document 1).

FIG. 15 shows a circuit configuration of a power amplifier disclosed in Document 1. Referring to FIG. 15, a power amplifier 900 includes a bipolar transistor Tr90 for power amplification, a diode D90, a capacitor C90, and bias resistors R91, R92. Diode D90 and capacitor C90 form a distortion compensation circuit. When a bias voltage Vb is supplied, the base bias condition of bipolar transistor Tr90 is determined by the direct current characteristics of bias resistors R91, R92 and diode D90.

Capacitor C90 has capacitance which is regarded as a grounded state regarding a high frequency at the operating frequency of power amplifier 900. Impedance measured from the base end of bipolar transistor Tr90 toward diode 90 is only the resistance and capacitance components of diode D90 with regard to a high frequency. The impedance is equivalent to parallel connection between the base and emitter of bipolar transistor Tr90 with regard to a high frequency.

An input signal causes the instantaneous voltage between the base and emitter of bipolar transistor Tr90 to fluctuate with time. However, since a diode characteristic is observed between the base and the emitter, higher voltage fluctuation and lower voltage fluctuation of the instantaneous voltage are asymmetrical, with the center being a voltage when a signal is not applied. Thus, the average voltage varies with input power. Specifically, because of the diode characteristics, when the voltage across the diode increases and the current increases, then the impedance is lowered. Since the voltage amplitude at the higher voltage side is small, the average voltage is shifted toward the lower voltage side because of the input signal. The shift amount increases with an increase in the input power.

The capacitance component of a diode depends on a voltage across the both ends of the diode (both end voltage dependence). Therefore, the voltage shift due to an increase in input power changes the capacitance between the base and emitter of bipolar transistor Tr90. Thus, the reactance component of bipolar transistor Tr90 from the base end is changed, which changes the transmit of a signal. This is "amplitude-phase distortion" as a cause of distortion for a power amplifier.

In power amplifier 900 shown in FIG. 15, phase distortion caused by the non-linearity of capacitance between the base and emitter of bipolar transistor Tr90 is compensated for by adding a distortion compensation circuit formed of diode D90 and capacitor C90.

In other words, an increase in input power decreases the average voltage of the diode portion (between the base and emitter) of bipolar transistor Tr90 and, at the same time, increases the average voltage across the both ends of diode D90 which is connected in parallel, with regard to a high frequency, with the base and emitter of bipolar transistor Tr90. Therefore, the change in the diode capacitance value between the base and emitter of bipolar transistor Tr90 and the change in the capacitance value of diode D90, which are caused by an increased or decreased input power, offset each other, mitigating the dependence of the transmit on the input power in the power amplifier. Thus, bipolar transistor Tr90 can effectively maintain linearity even at input power closer to saturation. As a result, the power efficiency is improved.

If bias power supply Vb and the base of bipolar transistor Tr90 are connected only through fixed resistance, the higher the base power caused by an increase in input power, the higher the effect of suppressing an increase in the base current becomes, which is caused by a reduction in the voltage at the fixed resistance portion. Therefore, the collector current is prevented from increasing, which reduces a gain due to an increase in the input power, that is, causes amplitude-amplitude distortion. In power amplifier 900, as the base current flowing in diode D90 is larger, the resistance component of diode D90 is lowered and the voltage drop is mitigated. It is therefore possible to reduce amplitude-amplitude distortion.

As described above, the amplitude-phase distortion characteristic and the amplitude-amplitude distortion characteristic have to be compensated for to lower distortion of the power amplifier. In the above described distortion compensation method in power amplifier 900, however, only the non-linearity of the resistance and capacitance components of diode D90 is used to provide compensation. Thus, once diode 90 to be used is determined, the non-linearity of the resistance and capacitance components are fixed at the same time. The non-linearity of them cannot be set to an optimum value separately.

Consequently, in some cases, only one of amplitude-phase distortion and amplitude-amplitude distortion can be compensated for or distortion compensation of one of them can exacerbate the other distortion. When the amplitude-phase distortion and amplitude-amplitude distortion are to be compensated for at the same time, compensation for both may be insufficient.

Such a power amplifier has to be operated at a higher bias current to maintain low distortion. If low distortion is realized, the power efficiency decreases, that is, the power consumption increases. Therefore, when the power amplifier is used for a battery-driven communication terminal, the communication time till the battery runs out is shortened.

SUMMARY OF THE INVENTION

Therefore, the present invention provides a power amplifier of low distortion and high power efficiency, and a low power consumption communication device including the power amplifier.

A power amplifier according to one aspect of the present invention includes a power amplification element including a first bipolar transistor of a common-emitter type, a voltage supply circuit for supplying the base of the first bipolar transistor with a bias voltage, and a distortion compensation circuit for compensating for distortion of the power amplification element. The distortion compensation circuit includes a variable impedance element provided between the voltage supply circuit and the base of the first bipolar transistor, and an adjustment circuit for adjusting at least one of a reactance component and a resistance component from the first transistor toward the variable impedance element.

Therefore, according to the power amplifier, the reactance component and the resistance component from the base end of the bipolar transistor for amplification toward the variable impedance element can be separately adjusted. Thus, amplitude-amplitude distortion and amplitudephase distortion can be separately compensated for. As a result, lower distortion of the power amplifier can be realized.

Preferably, the power amplifier includes a resistor having one terminal connected to the power supply circuit, and a capacitor connected between the other terminal of the resistor and a ground potential.

Therefore, according to the power amplifier, the reactance component and the resistance component from the base end of the bipolar transistor for amplification toward the variable impedance element can be separately adjusted by the resistor and the capacitor. Particularly, the smaller the resistance component is, the smaller the gain of the power amplifier becomes because of signal power consumption with the resistance component. For example, when adjustment of the reactance component is more effective than adjustment of the resistance component for distortion compensation, however, addition of the resistor can increase the resistance component and improve the gain of the power amplifier.

More preferably, the variable impedance element is formed of a diode element having an anode connected to the voltage supply circuit and a cathode connected to the base of the first bipolar transistor.

Therefore, according to the power amplifier, a diode is particularly used as the variable impedance element, and therefore the both end voltage dependence of the variable impedance element comes to have the same type as the both end voltage dependence of impedance at a diode portion between the base and emitter of the bipolar transistor used for amplification. It can be especially effective for distortion compensation in the case of a wide-ranging input power.

More preferably, the variable impedance element includes a second bipolar transistor configured to form a PN junction between the voltage supply circuit and the base of the first bipolar transistor.

Therefore, according to the power amplifier, employment of the diode portion of the bipolar transistor as the variable impedance element enables the variable impedance element to be manufactured in the same process as the bipolar transistor for amplification. Since a semiconductor element used for the power amplifier can be limited to one type of bipolar transistors, it simplifies the device parameter extraction process for circuit design of circuit elements used for the power amplifier. Since a power amplifier circuit including the variable impedance element can be formed in a monolithic manner on a semiconductor substrate, the power amplifier can be miniaturized.

More preferably, the variable impedance element is formed of a second bipolar transistor having an emitter connected to the base of the first bipolar transistor, a base connected to the voltage supply circuit, and a collector connected to a node for connecting the resistor and the capacitor.

Therefore, according to the power amplifier, the emitter current of the second bipolar transistor is a sum of the base current and the collector current. Since the collector current is almost proportional to the base current, the emitter current also has a diode-like current-voltage characteristic. Therefore, the second bipolar transistor functions as a variable impedance element.

Since the collector current is made variable by the resistor as a result, the emitter current is also made variable by the resistor. Therefore, even after a bipolar transistor, which also serves as a variable impedance element to be used, is selected, the variable resistance characteristic of the bipolar transistor can be adjusted by the resistor. As a result, the freedom of adjusting distortion compensation is increased.

More preferably, the variable impedance element is formed of a second bipolar transistor having a collector connected to the base of the first bipolar transistor, a base connected to the voltage supply circuit, and an emitter connected to a node for connecting the resistor and the capacitor.

Therefore, according to the power amplifier, the collector current of the second bipolar transistor has a diode-like current-voltage characteristic for the bias voltage and functions as a variable impedance element. In this case, since the emitter current is made variable by the resistor, the collector current is also made variable by the resistor. Therefore, even after a second bipolar transistor to be used is selected, the variable resistance characteristic of the second bipolar transistor can be adjusted by the resistor, and the freedom of adjusting distortion compensation is increased.

Preferably, the adjustment circuit includes a resistor having one terminal connected to the voltage supply circuit and the other terminal connected to the variable impedance element, and a capacitor connected between the voltage supply circuit and a ground potential.

Therefore, according to the power amplifier, the reactance component and the resistance component from the base end of the bipolar transistor for amplification toward the variable impedance element can be separately adjusted by the resistor and the capacitor. Thus, both amplitude-amplitude distortion and amplitude-phase distortion can be compensated for and the amplifier can have lower distortion.

More preferably, the variable impedance elements is formed of a second bipolar transistor having an emitter connected to the base of the first bipolar transistor, a collector connected to the voltage supply circuit, and a base connected to the other terminal of the resistor.

Therefore, according to the power amplifier, the emitter current of the second bipolar transistor is a sum of the base current and the collector current. Since the collector current is almost proportional to the base current, the emitter current also has a diode-like current-voltage characteristic for the bias voltage. Therefore, the second bipolar transistor functions as a variable impedance element. Since the base current is made variable by the resistor as a result, the collector current and the emitter current are also made variable by the resistor. Thus, even after a second bipolar transistor to be used is selected, the variable resistance characteristic of the second bipolar transistor portion can be adjusted by the resistor, and the freedom of adjusting distortion compensation is increased.

More preferably, the variable impedance element is formed of a second bipolar transistor having a collector connected to the base of the first bipolar transistor, an emitter connected to the voltage supply circuit, and a base connected to the other terminal of the resistor.

Therefore, according to the power amplifier, the collector current in the second bipolar transistor has a diode-like current-voltage characteristic for the bias voltage. Therefore, the second bipolar transistor functions as a variable impedance element. Since the base current is made variable by the resistor in this case, the emitter current and the collector current are also made variable by the resistor. Thus, even after a second bipolar transistor to be used is selected, the variable resistance characteristic of the second bipolar transistor portion can be adjusted by the resistor, and the freedom of adjusting distortion compensation is increased.

More preferably, the first bipolar transistor and the variable impedance element are formed on one semiconductor substrate.

Therefore, according to the power amplifier, the bipolar transistor for amplification and the variable impedance element which are formed on one substrate can be configured in a monolithic manner. Therefore, the power amplifier itself can be miniaturized.

Furthermore, the variable impedance element can be manufactured in the same process as the bipolar transistor for amplification. Since a semiconductor element used for the power amplifier can be limited to one type of bipolar transistors, it is possible to simplify the device parameter extraction process for circuit design of circuit elements used for the power amplifier.

Preferably, the first bipolar transistor operates in a Class B or Class AB mode.

Therefore, according to the power amplifier, employment of the variable impedance element and the adjustment circuit enables compensation of amplitude-amplitude distortion and amplitude-phase distortion. Thus, the bipolar transistor for amplification can be operated at a bias current in about the Class B or Class AB operating mode. As a result, the efficiency of the linear amplifier can be improved.

Preferably, the gain of the power amplifier can be controlled by controlling an output voltage of the voltage supply circuit.

Therefore, according to the power amplifier, the distortion compensation circuit is also used as the bias circuit of the first bipolar transistor. By controlling the output voltage of the voltage supply circuit, therefore, the bias current of the first bipolar transistor can be controlled. Thus, the gain of the power amplifier can be controlled while the function of distortion compensation is maintained. It is therefore possible to improve the power efficiency of a power amplifier used especially in a communication system which requires low distortion of the power amplifier and gain control in a wide dynamic range such as W-CDMA (Wide Band-Code Division Multiple Access) and IS-95 (interim standard 95).

Preferably, the power amplifier controls the distortion compensation amount of the distortion compensation circuit by controlling the output voltage from the voltage supply circuit.

Therefore, according to the power amplifier, a DC voltage across the variable impedance element included in the distortion compensation circuit can be controlled by controlling the output voltage of the voltage supply circuit. Thus, the impedance of the variable impedance element can be controlled. Since the distortion compensation amount of the distortion compensation circuit can be adjusted as a result, it is possible to provide distortion compensation corresponding to the degree of distortion caused in the first bipolar transistor. As a result, the freedom of distortion compensation is increased as compared with a case where the output voltage of the voltage supply circuit is fixed.

A communication device according to a further aspect of the present invention includes a power amplifier having a power amplification element including a first bipolar transistor of a common-emitter type for signal amplification and a distortion compensation circuit for compensating for distortion of the power amplification element, and a voltage supply circuit for supplying the base of the first bipolar transistor with a bias voltage. The distortion compensation circuit includes a variable impedance element provided between the voltage supply circuit and the base of the first bipolar transistor, and an adjustment circuit for adjusting at least one of a reactance component and a resistance component from the first bipolar transistor toward the variable impedance element.

Preferably, the adjustment circuit includes a resistor having one terminal connected to the voltage supply circuit, and a capacitor connected between the other terminal of the resistor and a ground potential.

More preferably, the variable impedance element is formed of a diode element having an anode connected to the voltage supply circuit and a cathode connected to the base of the first bipolar transistor.

More preferably, the variable impedance element includes a second bipolar transistor configured to form a PN junction between the voltage supply circuit and the base of the first bipolar transistor.

More preferably, the variable impedance element is formed of a second bipolar transistor having an emitter connected to the base of the first bipolar transistor, a base connected to the voltage supply circuit, and a collector connected to a node for connecting the resistor and the capacitor.

More preferably, the variable impedance element is formed of a second bipolar transistor having a collector connected to the base of the first bipolar transistor, a base connected to the voltage supply circuit, and an emitter connected to a node for connecting the resistor and the capacitor.

Preferably, the adjustment circuit includes a resistor having one terminal connected to the voltage supply circuit and the other terminal connected to the variable impedance element, and a capacitor connected between the voltage supply circuit and a ground potential.

More preferably, the variable impedance element is formed of a second bipolar transistor having an emitter connected to the base of the first bipolar transistor, a collector connected to the voltage supply circuit, and a base connected to the other terminal of the resistor.

More preferably, the variable impedance element is formed of a second bipolar transistor having a collector connected to the base of the first bipolar transistor, an emitter connected to the voltage supply circuit, and a base connected to the other terminal of the resistor.

More preferably, the first bipolar transistor and the variable impedance element are formed on one semiconductor substrate.

Preferably, the first bipolar transistor operates in a Class B or Class AB mode.

Preferably, the gain of the power amplifier is controlled by controlling an output voltage of the voltage supply circuit.

Preferably, the distortion compensation amount of the distortion compensation circuit is controlled by controlling the output voltage of the voltage supply circuit.

Therefore, according to the communication device, the power amplifier for transmission has low distortion and high efficiency and thus the power consumption of the communication device is reduced. Especially for a battery-run communication device, the communication time till the battery runs out can be increased. For attaining the same communication time as conventional products, a much smaller battery can be employed, resulting in a smaller or lighter communication terminal.

Preferably, the communication device is used in a communication system in which a signal includes an amplitude modulation component. If a transmitted signal includes an amplitude modulation component, distortion of the waveform of the transmitted signal at an amplification stage for amplifying the transmitted signal to a predetermined antenna output level makes it impossible to correctly demodulate the transmitted information at the receiver side. Therefore, the communication system requires a low distortion power amplifier which faithfully amplifies and outputs an input signal waveform as the power amplifier for transmission power. Such a communication system is, for example, W-CDMA, IS-95, PDC (Personal Digital Cellular), PHS (Personal Handy-Phone System), IMT-2000 (International Mobile Telecommunication 2000) and a wireless LAN (Local Area Network) at 5 GHz band.

Therefore, according to the communication device, the low distortion power amplifier is included for transmission and thus correct information can be transmitted to the receiver side without distortion of the waveform of the transmitted signal.

If the above-described communication device is used for the communication system such as W-CDMA, IS-95, PDC, PHS and IMT-2000 which requires a severe low distortion characteristic represented by adjacent channel leakage power standard for a power amplifier for transmission, it is possible to attain both low distortion and high efficiency. Since the power consumption of the communication device can be reduced, the communication time till the battery runs out can be increased if the communication device runs on a battery. For attaining the same communication time as conventional product, a much smaller battery can be used, resulting in a smaller or lighter communication terminal.

Preferably, the communication device further includes a detection circuit for detecting a signal power level input to the power amplifier or a signal power level output from the power amplifier, and a control circuit for controlling an output voltage of the voltage supply circuit according to the signal power level detected by the detection circuit.

Therefore, according to the communication device, even in a communication system which requires signal amplification with low distortion, the gain or the distortion compensation amount of the power amplifier can be controlled by controlling the output voltage of the voltage supply circuit according to the detected input signal level or output signal level so that power consumption is minimized with a prescribed gain or with distortion within a determined value. Therefore, the power consumption of the communication device is reduced and, in the case of a battery-driven communication device, the communication time till the battery runs out can be increased. For attaining the same communication time as conventional products, a much smaller battery can be used, resulting in a smaller or lighter communication terminal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
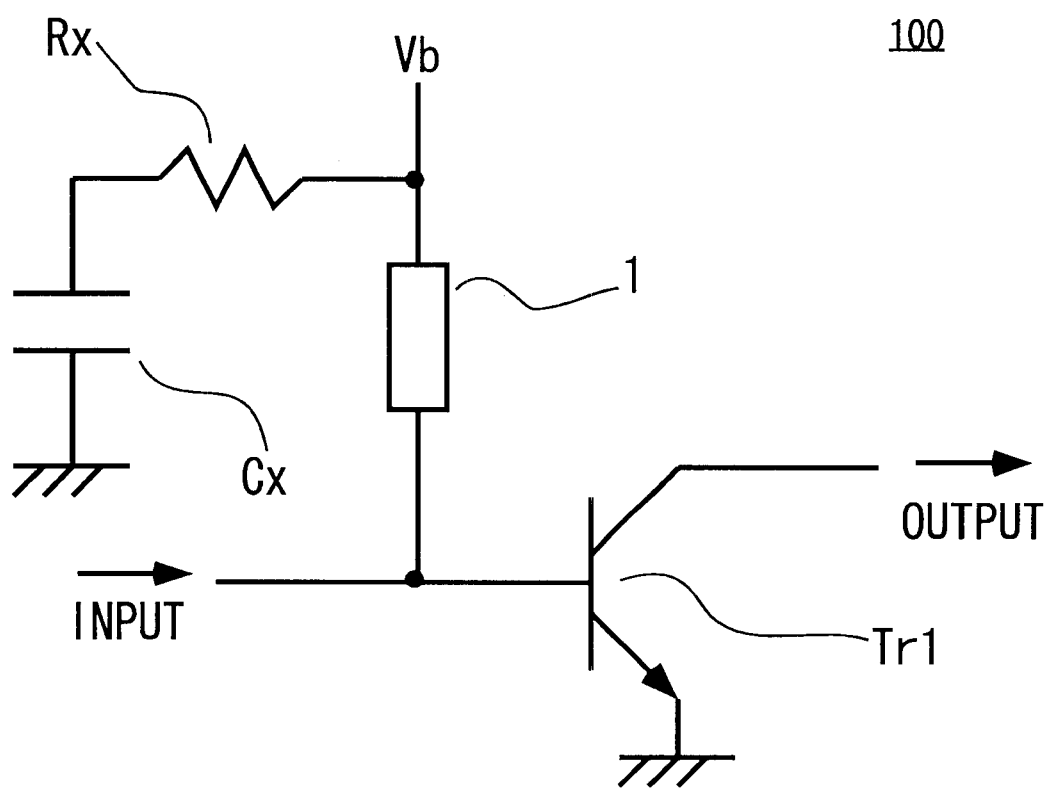
FIG. 1 shows a configuration of a power amplifier 100 in a first embodiment of the present invention.

A schematic configuration of a power amplifier 100 in a first embodiment of the present invention will be described with reference to FIG. 1. FIG. 1 shows a configuration of power amplifier 100 in the first embodiment of the present invention. Referring to FIG. 1, power amplifier 100 includes a common-emitter type bipolar transistor Tr1, a variable impedance element 1, a resistor Rx, and a capacitor Cx. Transistor Tr1 is a common-emitter type bipolar transistor for amplification, and variable impedance element 1, resistor Rx and capacitor Cx form a distortion compensation circuit.

Variable impedance element 1 is connected between a voltage terminal Vb and the base of bipolar transistor Tr1. Resistor Rx is connected between voltage terminal Vb and one terminal of capacitor Cx. The other terminal of capacitor Cx is connected to a ground potential. It may be considered that impedance from voltage terminal Vb toward the power supply with regard to a high frequency is incorporated as part of capacitor Cx and resistor Rx. One example of capacitor Cx is an MIM capacitor element.

Bipolar transistor Tr1 receives an input signal at the base and outputs a signal from the collector. In power amplifier 100, distortion compensation of the power amplifier is performed by using the non-linearity of reactance or resistance component of variable impedance element 1 and also using resistor Rx and capacitor Cx.

If variable impedance element 1 is expressed by parallel connection of variable capacitance Cd and variable resistance Rd, resistance component Rz and reactance component Bz across the both ends of the variable impedance element are represented by the following equations (1) and (2).

$$Rz = Rd/[1+(w \cdot Cd \cdot Rd)^2] \quad (1)$$

$$Bz = -w \cdot Cd \cdot Rd2/[1+(w \cdot Cd \cdot Rd)^2] \quad (2)$$

In the equations (1) and (2), $w=2\pi f$ (f is a signal frequency).

Reactance component Bt and resistance component Rt of impedance ($Zt=Rt+jBt$) from the base end of bipolar transistor Tr1 for amplification toward variable impedance element 1 are represented by the following equations (3) and (4).

$$Bt = Bz - 1/(w \cdot Cx) \quad (3)$$

$$Rt = Rz + Rx \quad (4)$$

In other words, the value of reactance component Bt and the change rate of reactance component Bt due to a change in reactance component Bz can also be adjusted by the capacitance of capacitor Cx. In addition, the value of resistance component Rt and the change rate of resistance component Rt due to a change in variable resistance Rd can also be adjusted by the resistance value of resistor Rx.

In other words, even after variable impedance element 1 to be used is set and the non-linearity of the resistance and capacitance components of variable impedance element 1 is fixed, the non-linearity of reactance component Bt and variable resistance component Rt of impedance Zt from the base end of bipolar transistor Tr1 for amplification toward the variable impedance element can be separately adjusted by resistor Rx and capacitor Cx.

Therefore, both amplitude-amplitude distortion and amplitude-phase distortion can be compensated for by resistor Rx and capacitor Cx, and lower distortion of the power amplifier can be realized.

As resistance component Rt is smaller, the gain of the power amplifier becomes smaller due to signal power consumption with the resistance component. If adjustment of reactance component Bt is more effective than adjustment of resistance component Rt for distortion compensation, for example, addition of resistor Rx can increase resistance component Rt. Thus, the gain of the power amplifier can be improved.

When impedance Zt from the base of bipolar transistor Tr1 for amplification toward variable impedance element 1 becomes excessively smaller than the input impedance of bipolar transistor Tr1, the degree of distortion compensation is so strong that distortion of the power amplifier is increased all the more. Conversely, when impedance Zt becomes excessively larger than the input impedance of bipolar transistor Tr1, the effect of distortion compensation is so small that distortion of the power amplifier cannot be fully reduced. Therefore, the resistance value of resistor Rx has an optimum value range, and it is preferable experimentally that the resistance value is approximately equal to the input impedance of bipolar transistor Tr1.

For example, in a power amplifier which outputs approximately one watt used in a current mobile communication system, the input impedance of the last stage transistor is from a few ohms to several tens of ohms. Thus, resistor Rx to be used is favorably one providing 10–100 ohms.

Figure 2:
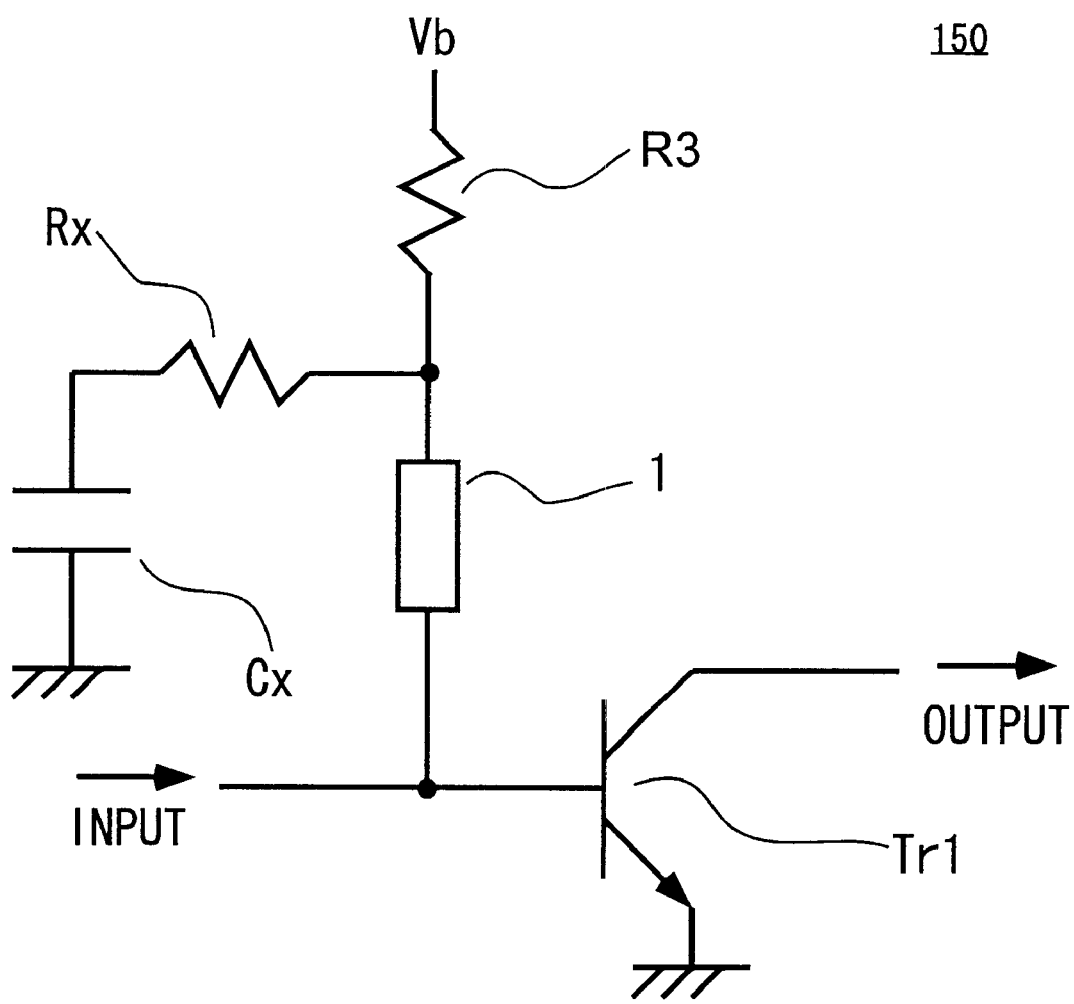
FIG. 2 shows one example of another configuration of the power amplifier in the first embodiment of the present invention.

FIG. 2 shows one example of another configuration of the power amplifier in the first embodiment of the present invention. A power amplifier 150 shown in FIG. 2 includes a resistor R3 in addition to the configuration of power amplifier 100. Resistor R3 is provided between voltage terminal Vb and variable impedance element 1. As described above, resistor R3 may be provided between variable impedance element 1 and voltage terminal Vb for the purpose of bias adjustment and additional distortion compensation. This also applies to power amplifiers described below.

For higher efficiency of the power amplifier, it is effective to operate bipolar transistor Tr1 for amplification in about the Class B (the direct current bias is set so that the collector-to-emitter voltage has a sine wave and the collector current has a half-wave rectification waveform) mode or the Class AB (the direct current bias is set between the Class B mode and the Class A mode in which the direct current bias is set so that the collector-to-emitter voltage and the collector current both have a sine wave) mode. Operation at these bias points usually easily causes distortion to an output waveform. However, the configuration according to the first embodiment of the present invention suppresses the distortion. Therefore, a highly efficient power amplifier can be realized by operation in about the Class AB mode or the Class B mode.

Second Embodiment

Figure 3:
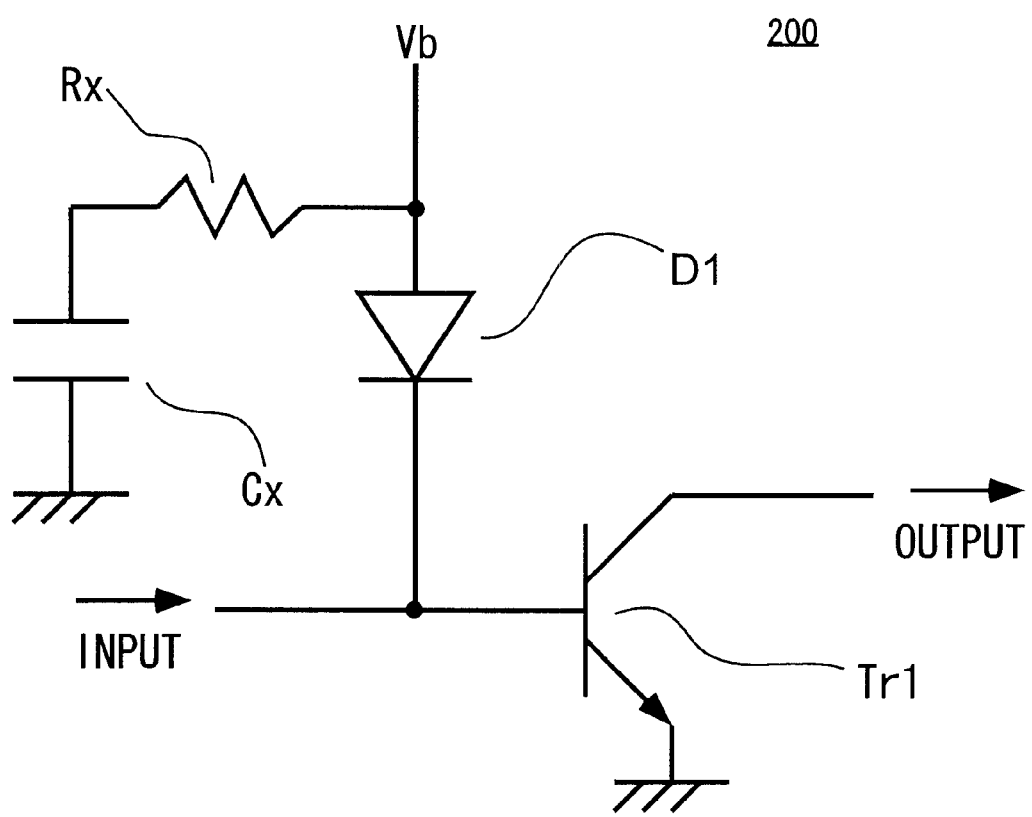
FIG. 3 shows a configuration of a power amplifier 200 in a second embodiment of the present invention.

A schematic configuration of a power amplifier in a second embodiment of the present invention will be described. FIG. 3 shows a configuration of a power amplifier 200 in the second embodiment of the present invention. Referring to FIG. 3, power amplifier 200 includes a common-emitter-type bipolar transistor Tr1 for amplification, a resistor Rx, a capacitor Cx, and a diode element D1. As shown in FIG. 3, diode element D1 is used as a variable impedance element (element 1 in FIG. 1) in the second embodiment of the present invention. Diode element D1 has its anode connected to a voltage terminal Vb and its cathode connected to the base of bipolar transistor Tr1.

The both end voltage dependence of diode D1 as a variable impedance element is the same type as the both end voltage dependence of impedance at a diode portion between the base and emitter of bipolar transistor Tr1. Thus, in the case of a wide-ranging input voltage and wide-ranging input power, the effect of distortion compensation becomes particularly remarkable.

Figure 4:
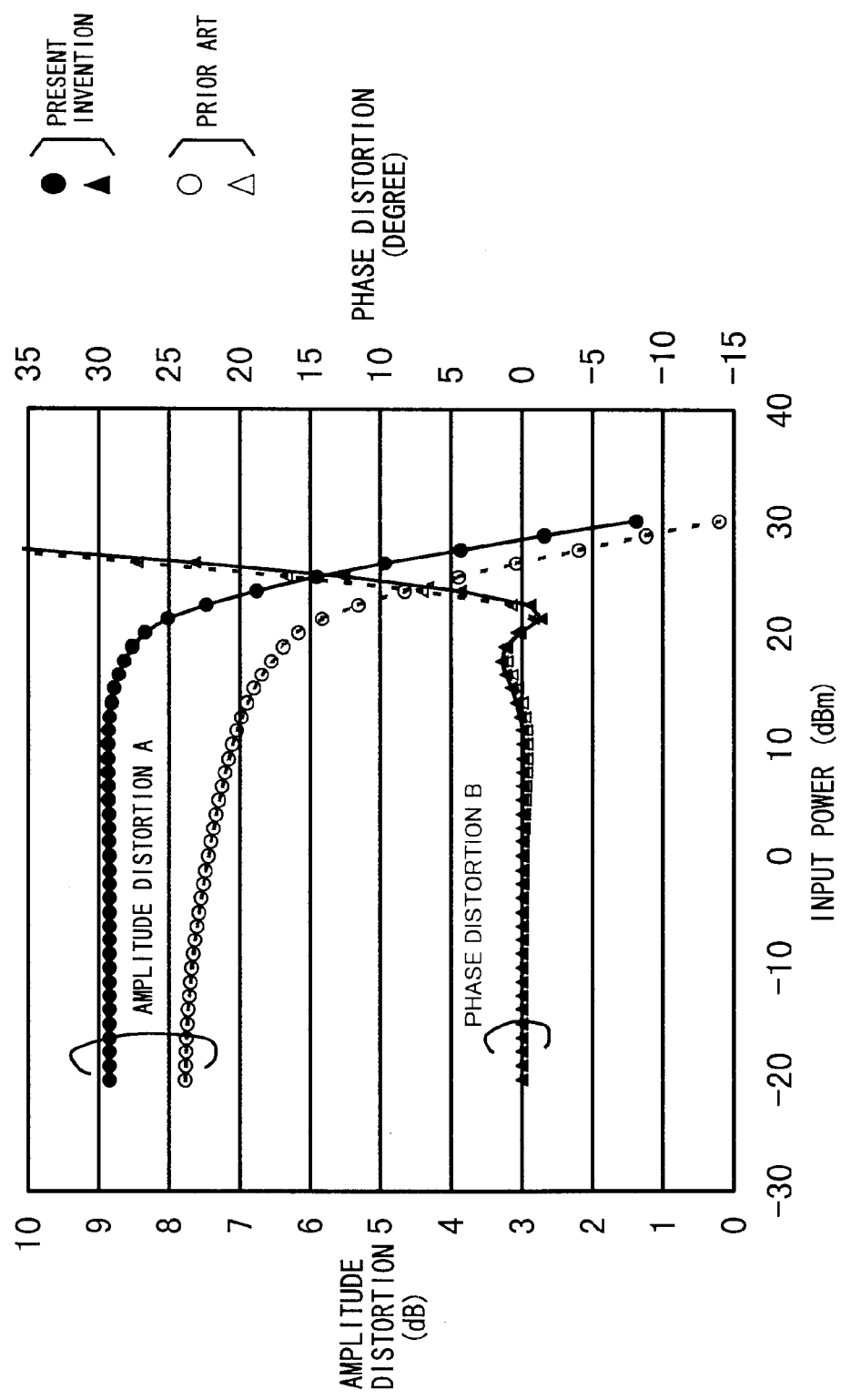
FIG. 4 shows the result of a test comparing operating characteristics of the power amplifier according to the present invention and a conventional power amplifier.
Figure 5:
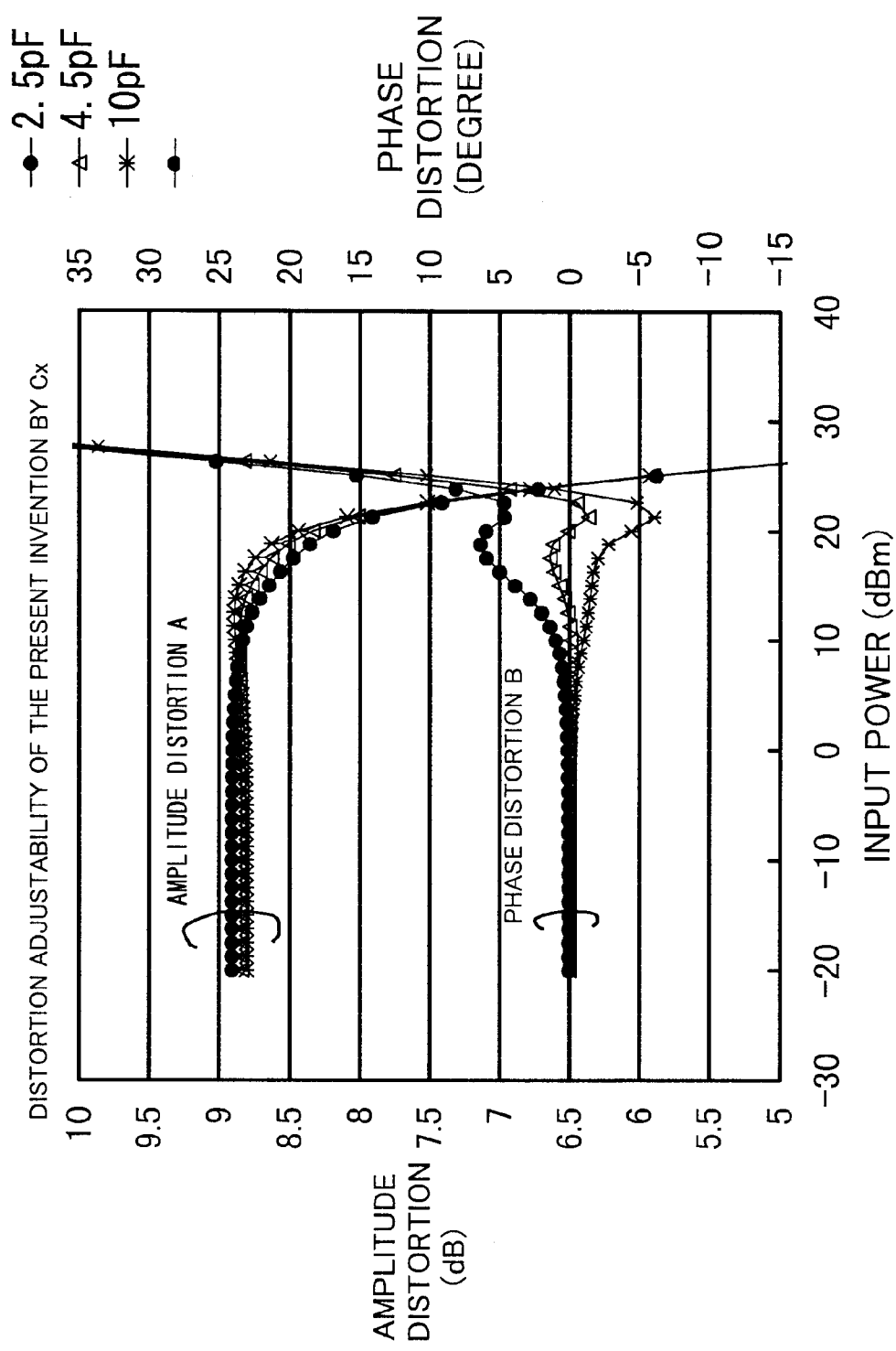
FIG. 5 shows the result of a test examining relations between a capacitor and an operating characteristic of the power amplifier according to the present invention.
Figure 6:
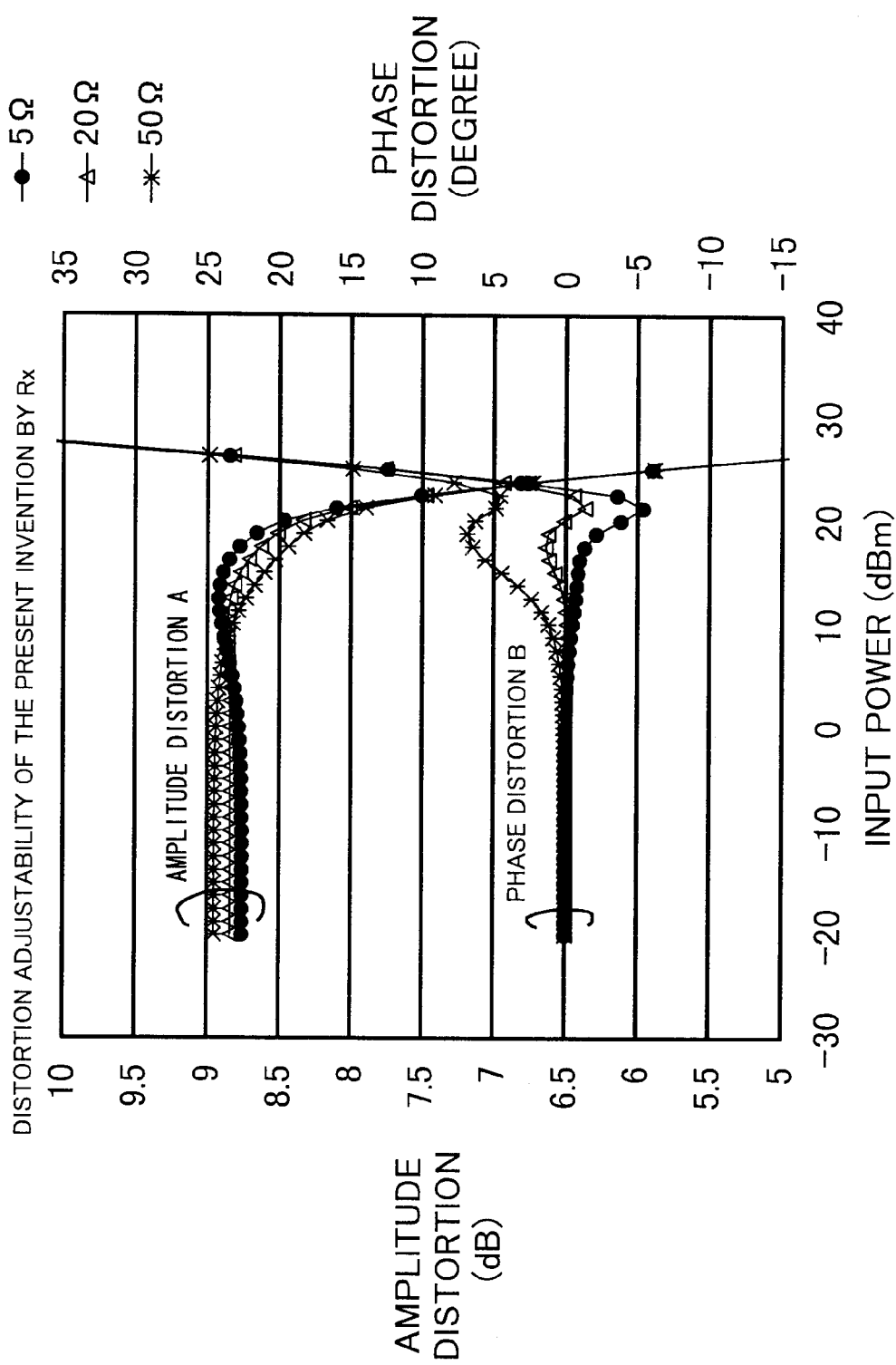
FIG. 6 shows the result of a test examining relations between a resistance value and an operating characteristic of a resistor in the power amplifier according to the present invention.
Figure 7A:
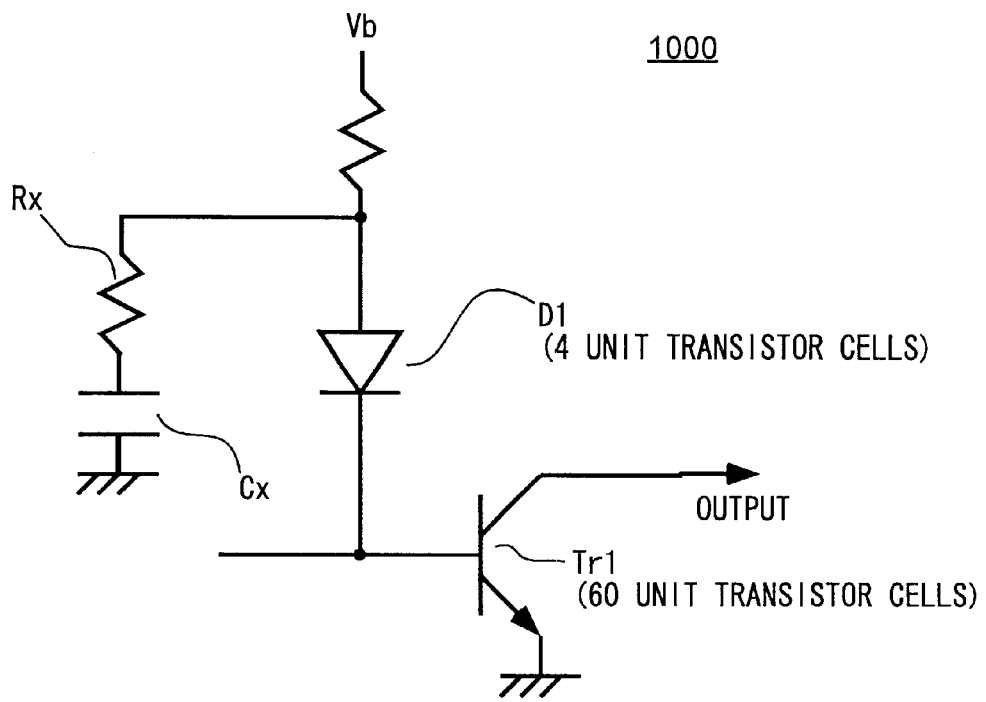
FIGS. 7A and 7B are conceptual diagrams for describing test conditions.
Figure 7B:
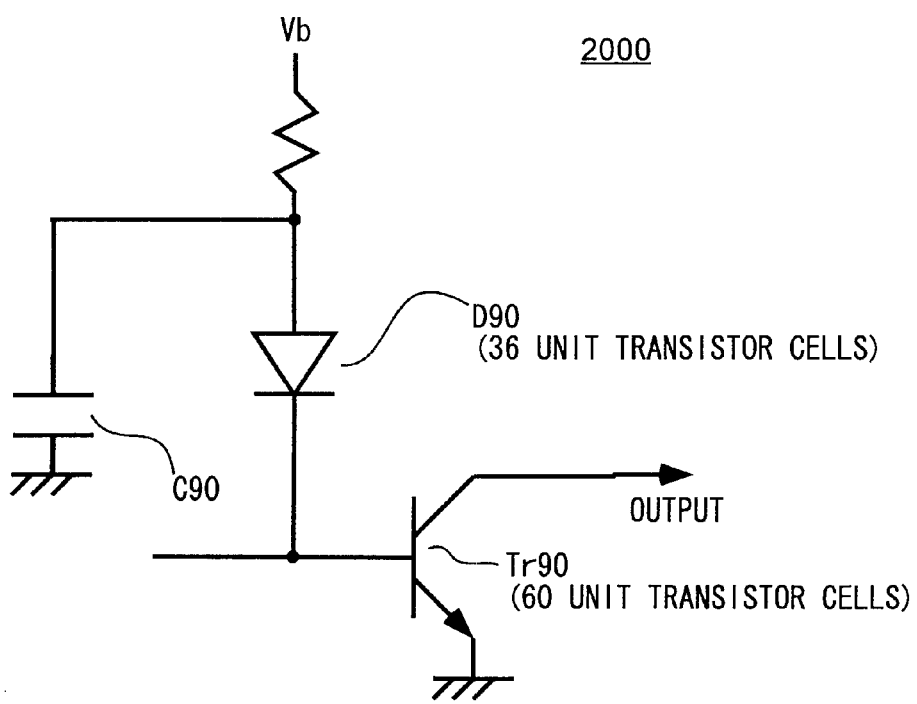

In the following, the test result concerning operating characteristics when a diode is used will be described with reference to FIGS. 4 to 7A and 7B. FIG. 4 shows the result of a test comparing operating characteristics of the power amplifier according to the present invention and a conventional power amplifier. FIG. 5 shows relations between the capacitor and the operating characteristic in the power amplifier according to the present invention. FIG. 6 shows the result of a test examining relations between the resistor and the operating characteristic in the power amplifier according to the present invention. FIGS. 7A and 7B are conceptual diagrams for describing test conditions. FIG. 7A corresponds to a power amplifier 1000 according to the present invention, while FIG. 7B corresponds to a conventional power amplifier 2000 formed for comparison.

For the test shown in FIG. 4, test conditions were determined so that power amplifier 1000 according to the present invention and conventional power amplifier 2000 have a similar degree of phase distortion. Specifically, the frequency was 1.95 GHz and 60 unit transistors connected in parallel were used as bipolar transistors Tr1, Tr90. For power amplifier 1000, a 20 Ω resistor Rx, a 4.5 pF capacitor Cx, and a diode D1 formed of four unit transistors connected in parallel were also used. For conventional power amplifier 2000, a 100 pF capacitor C90, and a diode D90 formed of 36 connected unit transistors were also used. For the tests of FIGS. 5 and 6, capacitor Cx and resistor Rx in FIG. 7A were changed.

In FIG. 4, the solid line with black circles corresponds to amplitude distortion of power amplifier 1000, the dash line with white circles corresponds to amplitude distortion of conventional power amplifier 2000. In addition, the solid line with black triangles corresponds to phase distortion of power amplifier 1000 according to the present invention, and the dash line with white triangles corresponds to phase distortion of conventional power amplifier 2000.

If the phase distortion is adjusted almost to the same extent, conventional power amplifier 2000 exhibits a reduced gain with an increase in the input power as shown in FIG. 4. In other words, the conventional power amplifier can adjust phase distortion although its compensation performance of amplitude distortion is low. On the contrary, power amplifier 1000 according to the present invention exhibits a widened range in which the gain is constant regardless of the input power. In other words, it is found out that the power amplifier according to the present invention can simultaneously compensate for both phase distortion and amplitude distortion.

In FIG. 5, the solid line with black circles corresponds to 2.5 pF, the solid line with white triangles corresponds to 4.5 pF, and the solid line with the symbols of * corresponds to 10 pF. Furthermore, group A is amplitude distortion and group B is phase distortion in FIG. 5.

In FIG. 6, the solid line with black circles corresponds to 5 Ω, the solid line with white triangles corresponds to 20 Ω, and the solid line with the symbols of * corresponds to 50 Ω. Furthermore, group A is amplitude distortion and group B is phase distortion in FIG. 6.

As can be seen from FIGS. 5 and 6, both phase distortion and amplitude distortion are compensated for at any values.

Since distortion can be suppressed even in the configuration according to the second embodiment of the present invention, operation in about the Class AB or Class B mode is possible. Thus, a higher efficient power amplifier can be realized.

Third Embodiment

Figure 8:
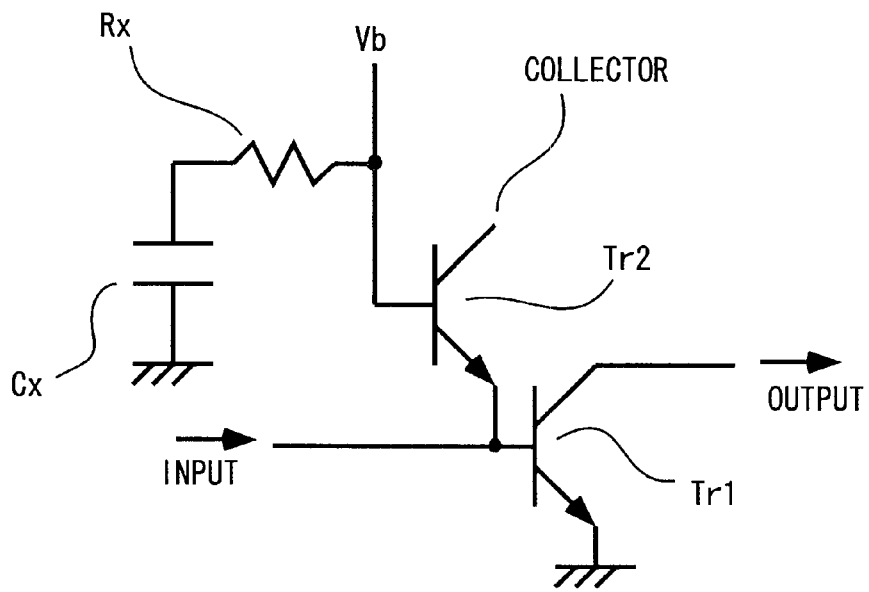
FIG. 8 shows a configuration of a power amplifier 300 in a third embodiment of the present invention.

A schematic configuration of a power amplifier in a third embodiment of the present invention will be described. FIG. 8 shows a configuration of a power amplifier 300 in the third embodiment of the present invention. Referring to FIG. 8, power amplifier 300 includes a common-emitter type bipolar transistor Tr1 for amplification, a resistor Rx, a capacitor Cx, and a bipolar transistor Tr2. In the third embodiment of the present invention, a PN junction (diode) between the base and emitter of bipolar transistor Tr2 is used as a variable impedance element 1. The emitter of bipolar transistor Tr2 is connected to the base of bipolar transistor Tr1 for amplification. The base of bipolar transistor Tr2 is connected to a voltage terminal Vb.

Although the collector terminal of bipolar transistor Tr2 is not used in the third embodiment of the present invention, the collector of bipolar transistor Tr2 may be connected to the base of bipolar transistor Tr1 for amplification, and the PN junction between the base and collector of bipolar transistor Tr2 may be used as a variable impedance element (diode element).

Figure 16A:
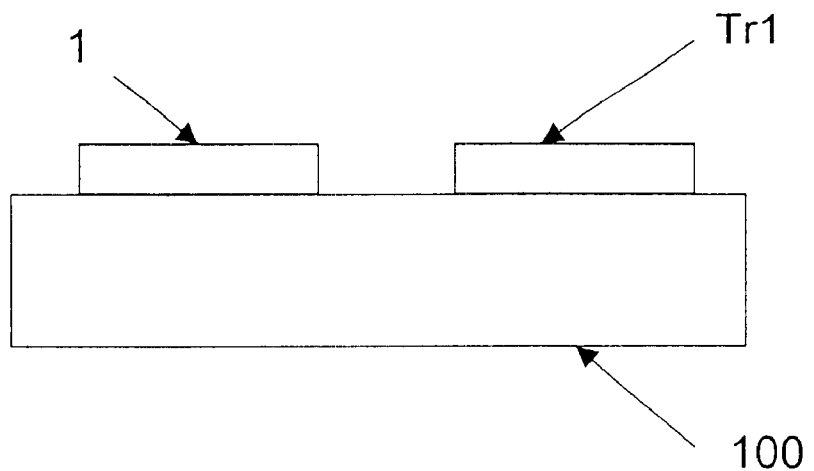
FIGS. 16A and 16B represent a variable impedance element and an amplifier transistor being formed on a common substrate.
Figure 16B:
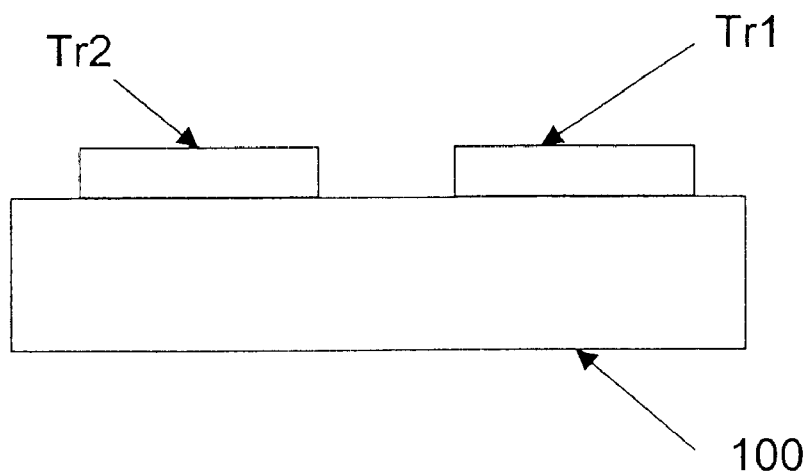

By using the diode portion between the base and emitter (or between the base and collector) of bipolar transistor Tr2 as a variable impedance element, bipolar transistor Tr1 for amplification and bipolar transistor Tr2 can be manufactured in the same manufacturing process. Sine a semiconductor element used for the power amplifier can be limited to one kind of bipolar transistors, it is possible to simplify the device parameter extraction process for circuit designing of circuit elements used for the power amplifier. Furthermore, the power amplifier circuit including the variable impedance element 1 can be formed in a monolithic manner on a semiconductor substrate 100, and therefore the power amplifier itself can be miniaturized, as represented in FIGS. 16A and 16B.

Since distortion can be suppressed even in the configuration according to the third embodiment of the present invention, operation in about the Class AB mode or the Class B mode is possible. Thus, a highly efficient power amplifier can be realized.

Fourth Embodiment

Figure 9:
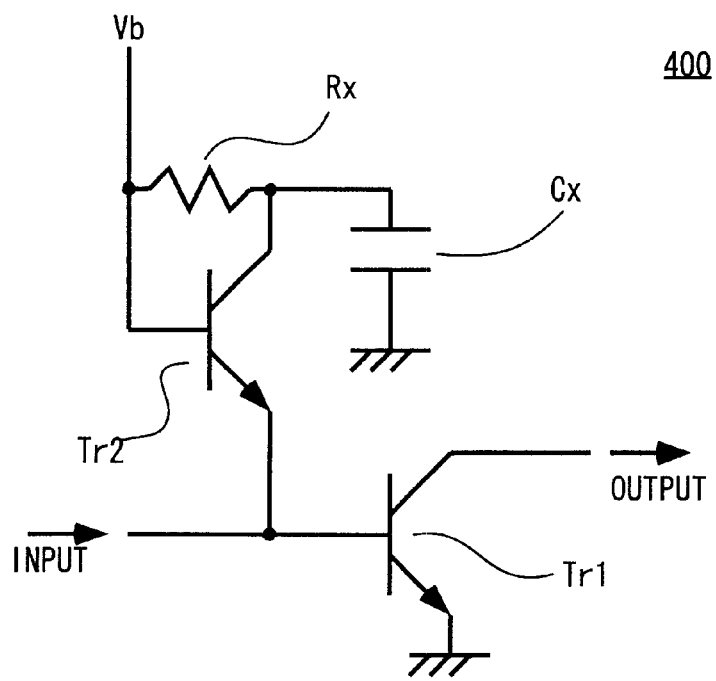
FIG. 9 shows a configuration of a power amplifier 400 in a fourth embodiment of the present invention.

A schematic configuration of a power amplifier according to a fourth embodiment of the present invention will be described. FIG. 9 is a diagram for describing a configuration of a power amplifier 400 in the fourth embodiment of the present invention. Referring to FIG. 9, power amplifier 400 includes a common-emitter type bipolar transistor Tr1 for amplification, a resistor Rx, a capacitor Cx, and a bipolar transistor Tr2. Resistor Rx and capacitor Cx are connected in series between a voltage terminal Vb and a ground potential. Bipolar transistor Tr2 has its collector connected to a node for connecting resistor Rx and capacitor Cx, its base connected to voltage terminal Vb, and its emitter connected to the base of bipolar transistor Tr1 for amplification.

If the emitter current, base current and collector current of bipolar transistor Tr2 are Ie2, Ib2 and Ic2, respectively, then emitter current Ie2 is a sum of base current Ib2 and collector current Ic2 and collector current Ic2 is almost proportional to base current Ib2. Therefore, emitter current Ie2 also exhibits a diode-like current-voltage characteristic for voltage Vb. In other words, bipolar transistor Tr2 functions as a variable impedance element.

For power amplifier 100 in the first embodiment of the present invention, one end of resistor Rx is open with regard to direct current. Even if the bipolar transistor is used as variable impedance element 1, therefore, resistor Rx does not influence the bias state of the bipolar transistor. On the contrary, in the fourth embodiment of the present invention, resistor Rx is connected in series between voltage terminal Vb and the collector of bipolar transistor Tr2, and collector current Ic2 is made variable by resistor Rx. Therefore, emitter current Ie2 is also made variable by resistor Rx. Consequently, even after bipolar transistor Tr2 to be used is selected, the variable resistance characteristic of bipolar transistor Tr2 can be adjusted by resistor Rx, and the freedom of adjusting distortion compensation is increased.

Since distortion can be suppressed even in the configuration according to the fourth embodiment of the present invention, operation in about the Class AB mode or the Class B mode is possible. Thus, a highly efficient power amplifier can be realized.

Fifth Embodiment

Figure 10:
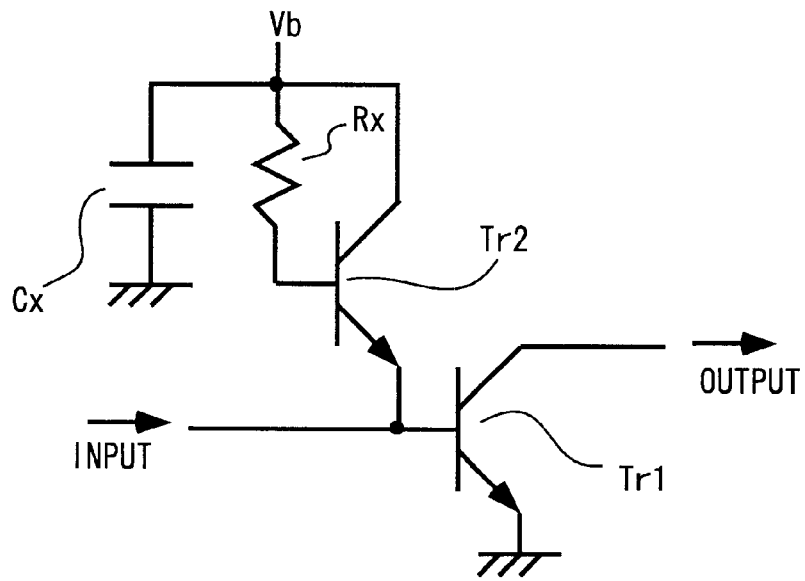
FIG. 10 shows a configuration of a power amplifier 500 in a fifth embodiment of the present invention.

A schematic configuration of a power amplifier in a fifth embodiment of the present invention will be described. FIG. 10 shows a configuration of a power amplifier 500 in the fifth embodiment of the present invention. Referring to FIG. 10, power amplifier 500 includes a common-emitter type bipolar transistor Tr1 for amplification, a resistor Rx, a capacitor Cx, and a bipolar transistor Tr2. Capacitor Cx is connected between a voltage terminal Vb and a ground potential. Resistor Rx is connected between voltage terminal Vb and the base of bipolar transistor Tr2. Bipolar transistor Tr2 has its collector connected to voltage terminal Vb and its emitter connected to the base of bipolar transistor Tr1.

If the emitter current, base current and collector current of bipolar transistor Tr2 are Ie2, Ib2 and Ic2, respectively, then emitter current Ie2 is a sum of base current Ib2 and collector current Ic2 and collector current Ic2 is almost proportional to base current Ib2. Therefore, emitter current Ie2 has a diode-like current-voltage characteristic for voltage Vb. Thus, bipolar transistor Tr2 functions as a variable impedance element.

Since base current Ib2 is made variable by resistor Rx in this case, collector current Ic2 and emitter current Ie2 are also made variable by resistor Rx. Therefore, even after bipolar transistor Tr2 to be used is selected, the variable resistance characteristic of bipolar transistor Tr2 can be adjusted by resistor Rx. As a result, the freedom of adjusting distortion compensation is increased.

Since distortion can be suppressed even in the configuration according to the fifth embodiment of the present invention, operation in about the Class AB mode or Class B mode is possible. Thus, a highly efficient power amplifier can be realized.

Sixth Embodiment

Figure 11:
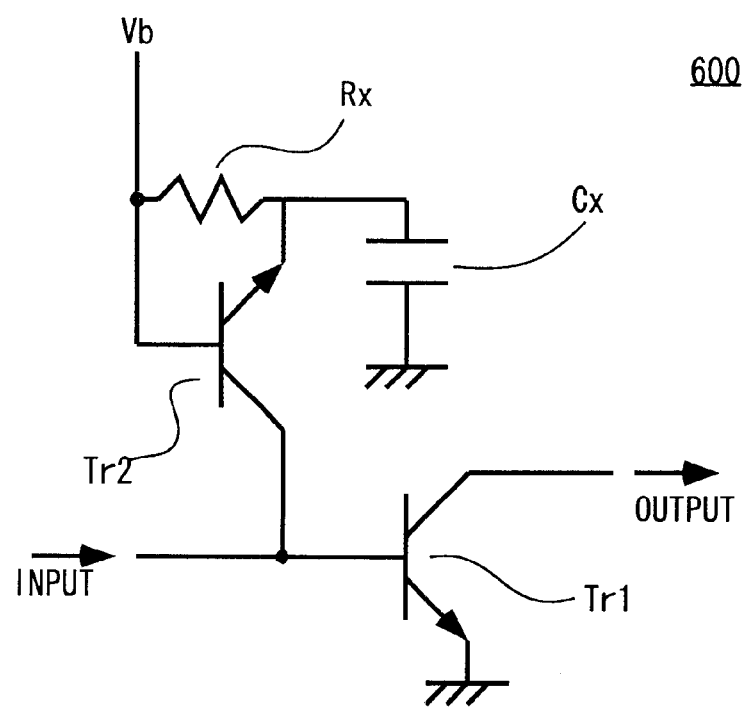
FIG. 11 shows a configuration of a power amplifier 600 in a sixth embodiment of the present invention.

A schematic configuration of a power amplifier in a sixth embodiment of the present invention will be described. FIG. 11 shows a configuration of a power amplifier 600 in the sixth embodiment of the present invention. Referring to FIG. 11, power amplifier 600 includes a common-emitter type bipolar transistor Tr1 for amplification, a resistor Rx, a capacitor Cx, and a bipolar transistor Tr2. Resistor Rx and capacitor Cx are connected in series between a voltage terminal Vb and a ground potential. Bipolar transistor Tr2 has its emitter connected to a node for connecting resistor Rx and capacitor Cx, its collector connected to the base of bipolar transistor Tr1, and its base connected to voltage terminal Vb. Power amplifier 600 is different from power amplifier 400 in the fourth embodiment in that connection of the emitter and the collector is opposite.

A transistor performs its operation even if the emitter and the collector are connected oppositely. Therefore, since collector current Ic2 is almost proportional to base current Ib2 in this case as well, collector current Ic2 has a diode-like current-voltage characteristic for voltage Vb. In other words, bipolar transistor Tr2 functions as a variable impedance element. Since collector current Ic2 and emitter current Ie2 are made variable by resistor Rx, the variable resistance characteristic of bipolar transistor Tr2 can be adjusted by resistor Rx even after bipolar transistor Tr2 to be used is selected. As a result, the freedom of adjusting distortion compensation is increased.

Since distortion can be suppressed even in the configuration according to the sixth embodiment of the present invention, operation in about the Class AB mode or Class B mode is possible. Thus, a highly efficient power amplifier can be realized.

Seventh Embodiment

Figure 12:
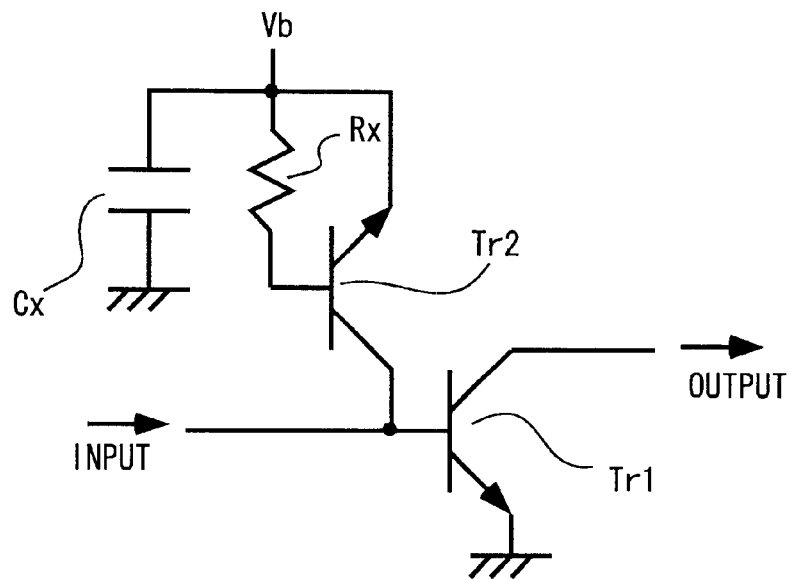
FIG. 12 shows a configuration of a power amplifier 700 in a seventh embodiment of the present invention.
Figure 15:
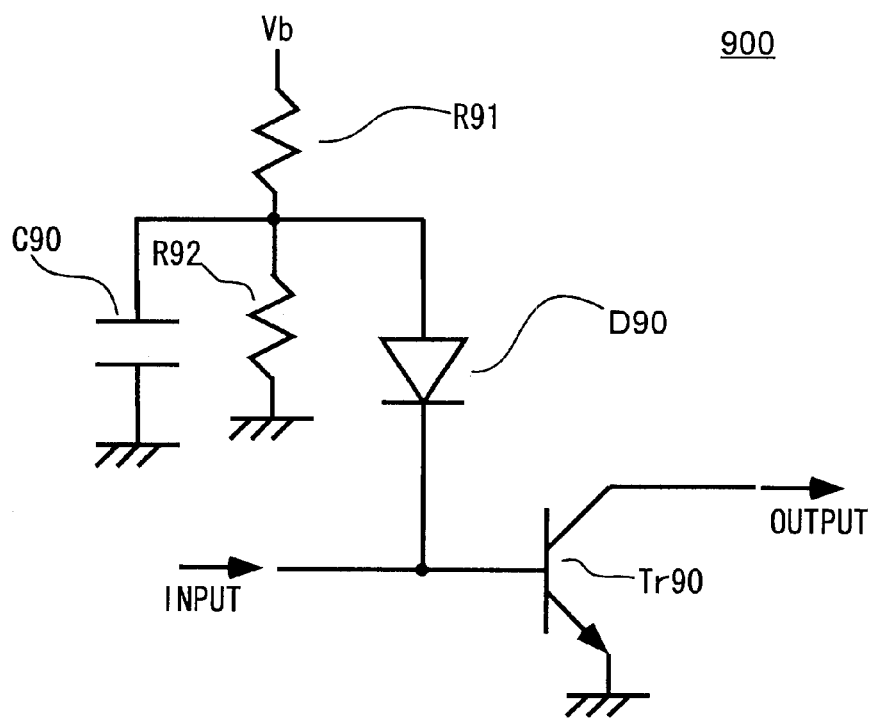
FIG. 15 shows a configuration of a power amplifier 900 described in Document 1.

A schematic configuration of a power amplifier in a seventh embodiment of the present invention will be described. FIG. 12 shows a configuration of a power amplifier 700 in the seventh embodiment of the present invention. Referring to FIG. 12, power amplifier 700 includes a common-emitter type bipolar transistor Tr1 for amplification, a resistor Rx, a capacitor Cx, and a bipolar transistor Tr2. Capacitor Cx is connected between a voltage terminal Vb and a ground potential. Resistor Rx is connected between voltage terminal Vb and the base of bipolar transistor Tr2. Bipolar transistor Tr2 has its emitter connected to voltage terminal Vb which is connected to the base of bipolar transistor Tr2 Power amplifier 700 is different from power amplifier 500 in the fifth embodiment in that connection of the emitter and the collector is opposite.

A transistor performs its operation even if the emitter and the collector are oppositely connected. Therefore, since collector current Ic2 is also almost proportional to base current Ib2 in this case as well, collector current Ic2 has a diode-like current-voltage characteristic for voltage Vb. In other words, bipolar transistor Tr2 can function as a variable impedance element. In addition, collector current Ic2 and emitter current Ie2 are also made variable by resistor Rx. As a result, even after bipolar transistor Tr2 to be used is selected, the variable resistance characteristic of bipolar transistor Tr2 can be adjusted by resistor Rx, and the freedom of adjusting distortion compensation is increased.

Since distortion can be suppressed even in the configuration according to the seventh embodiment of the present invention, operation in about the Class AB mode or Class B mode is possible. Thus, a highly efficient power amplifier can be realized.

Bias voltage Vb in the first to seventh embodiments of the present invention is supplied from a voltage supply circuit 1005 as described below. In this case, the gain of the power amplifier may be controlled by controlling output voltage Vb of the voltage supply circuit. Since the distortion compensation circuit also serves as a bias circuit for the first bipolar transistor (bipolar transistor Tr1), the bias current of the first bipolar transistor can be controlled by controlling the output voltage. As a result, the gain of the power amplifier can be controlled while the function of distortion compensation is maintained.

Especially in a communication system which requires low distortion for the power amplifier and gain control in a wide dynamic range such as W-CDMA and IS-95, it becomes possible to improve the power efficiency of a power amplifier.

Furthermore, in the first to seventh embodiments of the present invention, the distortion compensation amount of the distortion compensation circuit can be controlled by controlling the output voltage of the voltage supply circuit.

Since a DC voltage across the variable impedance element included in the distortion compensation circuit can be controlled by controlling the output voltage of the voltage supply circuit, the impedance of the variable impedance element can be controlled. It is therefore possible to provide distortion compensation according to the degree of distortion caused in the first bipolar transistor, which can adjust the distortion compensation amount in the distortion compensation circuit. By controlling the output voltage of the voltage supply circuit, therefore, the freedom of distortion compensation is increased as compared with a case where the output voltage of the voltage supply circuit is fixed.

Eighth Embodiment

Figure 13:
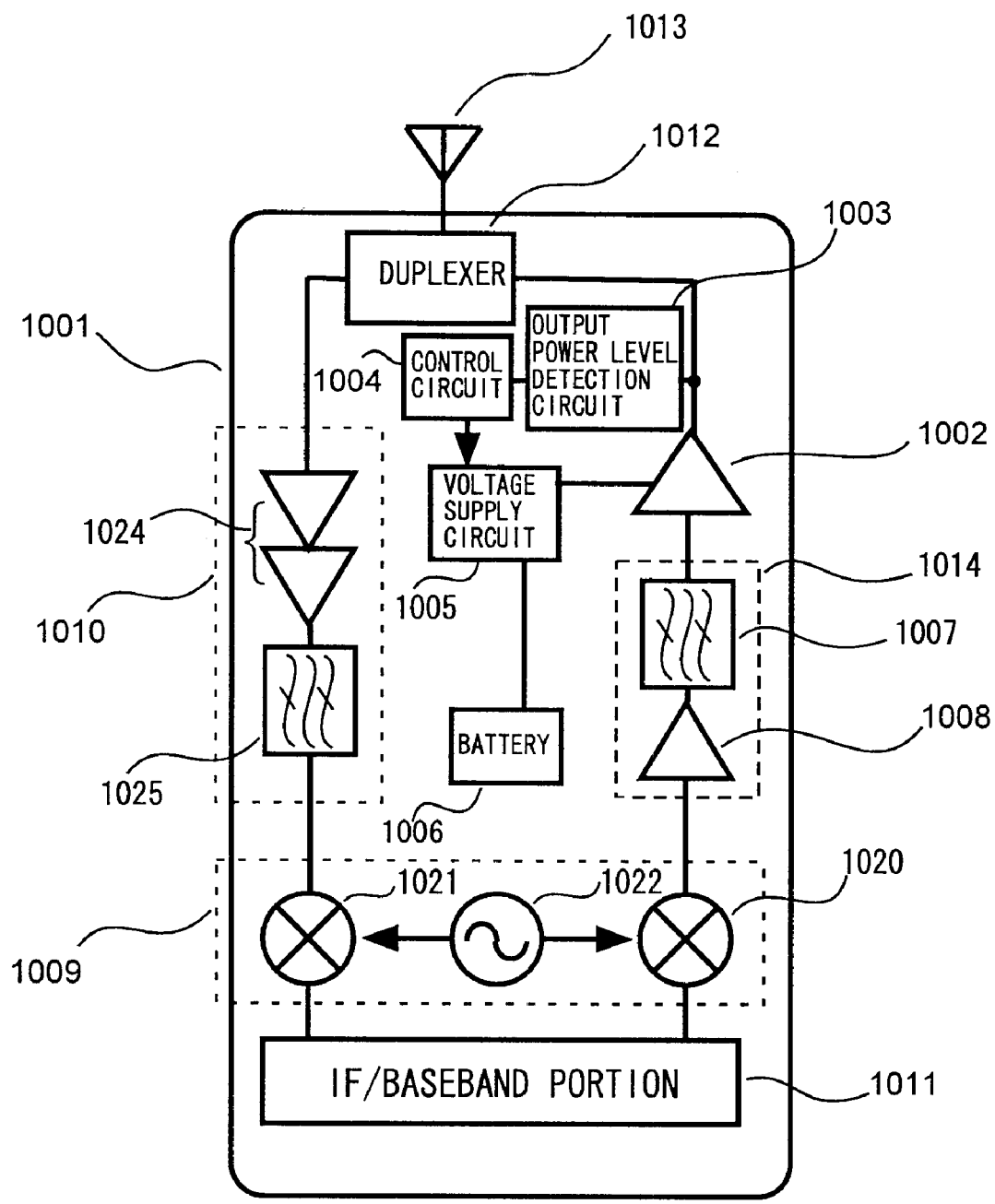
FIG. 13 shows a configuration of a main part of a communication device 1001 in an eighth embodiment of the present invention.

A schematic configuration of a communication device in an eighth embodiment of the present invention will be described. FIG. 13 shows a configuration of a main part of a communication device 1001 in the eighth embodiment of the present invention.

Referring to FIG. 13, communication device 1001 includes a power amplifier 1002, an output power level detection circuit 1003 for detecting the output level of power amplifier 1002, a control circuit 1004 for controlling a voltage supply circuit 1005 according to an output of output power level detection circuit 1003, a voltage supply circuit 1005 for supplying power amplifier 1002 with a bias voltage according to the control of control circuit 1004, and a battery 1006 as a main power supply for driving each circuit portion of the communication device.

One of the power amplifiers described in the first to seventh embodiments of the present invention is used for power amplifier 1002.

The base of bipolar transistor Tr1 included in power amplifier 1002 is supplied with the bias voltage from voltage supply circuit 1005.

Communication device 1001 further includes a frequency conversion portion 1009, an RF portion 1010 for reception, an IF/baseband portion 1011, an RF portion 1014 for transmission, a duplexer 1012, and an antenna 1013 (RF: Radio Frequency, IF: Intermediate Frequency).

Frequency conversion portion 1009 includes mixers 1020, 1021 and a VCO 1022 (Voltage Controlled Oscillator). Mixer 1020 mixes outputs of IF/baseband portion 1011 and VCO 1022. Mixer 1021 mixes outputs of reception RF portion 1010 and VCO 1022.

Transmission RF portion 1014 includes a driver amplifier, a filter and so on. In the figure, a driver amplifier 1008 and a filter 1007 receiving an output of driver amplifier 1008 are representatively shown as components of transmission RF portion 1014. In this example, driver amplifier 1008 receives an output of mixer 1020 and power amplifier 1002 amplifies an output of filter 1007.

Reception RF portion 1010 includes a low noise amplifier, a filter and so on. In the figure, a low noise amplifier 1024 and a filter 1025 receiving an output of low noise amplifier 1024 are representatively shown as components of reception RF portion 1010. In this example, low noise amplifier 1024 receives an output of duplexer 1012 and mixer 1021 is supplied with an output of filter 1025.

Antenna 1013 is used for transmission and reception. Duplexer 1012 isolates a transmission RF signal and a reception RF signal.

The reception RF signal is converted to an IF signal by frequency conversion portion 1009 after passing through reception RF portion 1010. The IF signal is subjected to signal processing by IF/baseband portion 1011.

A signal output from IF/base band portion 1011 is converted to an RF signal by frequency conversion portion 1009. The RF signal is amplified by power amplifier 1002 after passing through transmission RF portion 1014. Then, an output of power amplifier 1002 is output from antenna 1013.

Power amplifier 1002 in the eighth embodiment of the present invention is a component at the last stage of the transmission portion. Since the power amplifier at the last stage of the transmission portion has to amplify the largest signal power in the communication device, it consumes a large amount of power. In a battery-driven communication device such as a mobile phone, for example, power consumption of the power amplifier accounts for most of power consumption of the entire communication device at the time of communication.

Therefore, one of low distortion and highly efficient power amplifiers in the first to seventh embodiments of the present invention is used as power amplifier 1002. Thus, the power consumption of the entire communication device can be reduced. Especially for a battery driven communication device, the communication time till the battery runs out can be increased. For attaining the same communication time as conventional products, a much smaller battery can be used, resulting in a smaller or lighter communication terminal.

Since both low distortion and high efficiency can be realized for power amplifier 1002 for transmission, it is a desirable embodiment of the present invention to use communication device 1001 in the eighth embodiment of the present invention in a communication system which requires a severe low distortion characteristic represented by adjacent channel leakage power standard for a power amplifier for transmission such as W-CDMA, IS-95, PDC, PHS and IMT-2000.

If a transmitted signal includes an amplitude modulation component, distortion of the waveform of the transmitted signal at an amplification stage for amplifying the transmitted signal to a determined antenna output level prevents correct demodulation of the transmitted information at the receiver side. In such a communication system (W-CDMA, IS-95, PDC, PHS, IMT-2000, a wireless LAN at 5 GHz band), a low distortion power amplifier which faithfully amplifies and outputs an input signal waveform is required as a power amplifier for transmission power. Since communication device 1001 includes low distortion power amplifier 1002 for transmission, it can correctly transmit a transmitted signal including an amplitude modulation component to the receiver side.

Furthermore, the gain of power amplifier 1002 or the distortion compensation amount of the distortion compensation circuit may be controlled by detecting the output signal level of power amplifier 1002 using output power level detection circuit 1003 and controlling the output voltage of voltage supply circuit 1005 using control circuit 1004 according to the detected output signal level.

Since the distortion compensation circuit included in power amplifier 1002 also serves as a bias circuit of the first bipolar transistor (bipolar transistor Tr1), the bias current of the first bipolar transistor can be controlled by controlling the output voltage of voltage supply circuit 1005. Therefore, the gain of the power amplifier can be controlled while the function of distortion compensation is maintained. When power amplifier 1002 is used, therefore, it is possible to improve the power efficiency of a power amplifier in a communication system which requires low distortion for the power amplifier and gain control in a wide dynamic range such as W-CDMA and IS-95. Thus, the power consumption of a communication terminal can be reduced by controlling the output voltage of voltage supply circuit 1005.

Since a DC voltage across the variable impedance element included in the distortion compensation circuit can be controlled by controlling the output voltage of voltage supply circuit 1005, the impedance of the variable impedance elements can be controlled. Since the distortion compensation amount of the distortion compensation circuit can be adjusted as a result, it is possible to provide distortion compensation according to the degree of distortion caused in the first bipolar transistor. When the output voltage of voltage supply circuit 1005 is controlled, therefore, the freedom of distortion compensation is increased as compared with a case where the output voltage of the voltage supply circuit is fixed.

Although the output power level of power amplifier 1002 is detected at its output end in FIG. 13, the voltage level may be detected at an arbitrary portion of the path from power amplifier 1002 to antenna 1013 (although not shown, a filter, an isolator or the like may be added).

Figure 14:
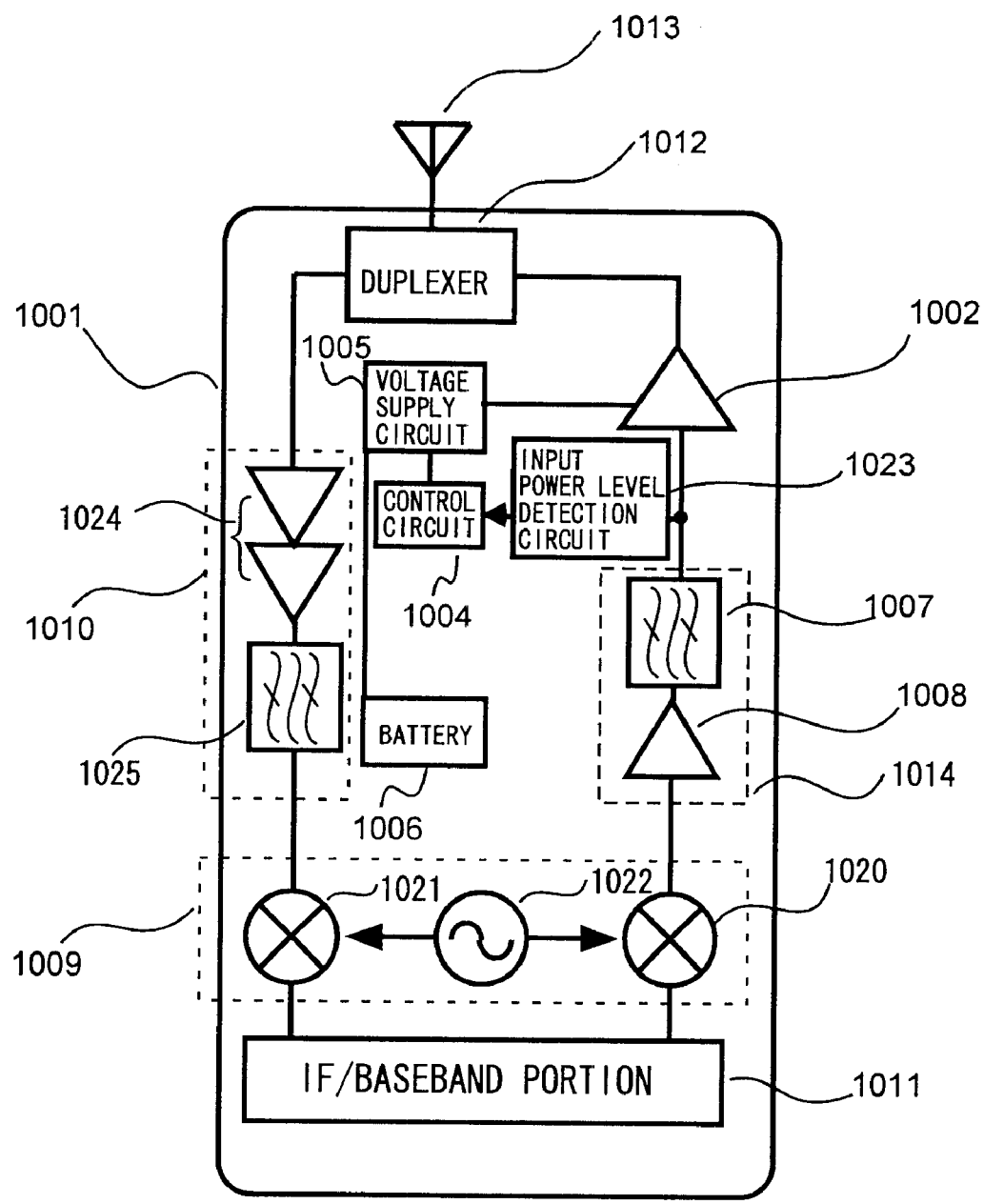
FIG. 14 shows another configuration example of the main part of communication device 1001 in the eighth embodiment of the present invention.

As shown in FIG. 14, an input power level detection circuit 1023 for detecting the signal level of power amplifier 1002 at its input side may be provided instead of output power level detection circuit 1003. In this case, control circuit 1004 controls power supply circuit 1005 according to an output of input power level detection circuit 1023. As described above, the gain of power amplifier 1002 or the distortion compensation amount may be controlled by input power level detection circuit 1023.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power amplifier, comprising:
   a power amplification element including a first bipolar transistor of a common-emitter type;
   a voltage supply circuit for supplying a base of said first bipolar transistor with a bias voltage; and
   a distortion compensation circuit for compensating for distortion of said power amplification element,
   said distortion compensation circuit including:
      a variable impedance element provided between said voltage supply circuit and the base of said first bipolar transistor, and
      an adjustment circuit which compensates for said distortion of said power amplification element by adjusting a value of at least one of a reactance component and a resistance components
   wherein said variable impedance element is formed of a second bipolar transistor having an emitter connected to the base of said first bipolar transistor, a base connected to said voltage supply circuit, and a collector connected to a node for connecting said adjustment circuit.

2. The power amplifier according to claim 1, wherein said adjustment circuit includes
   a resistor having one terminal connected to said voltage supply circuit, and
   a capacitor connected between another terminal of said resistor and a ground potential.

3. The power amplifier according to claim 1, wherein said adjustment circuit includes:
   a resistor having one terminal connected to said voltage supply circuit and another terminal connected to said variable impedance element, and
   a capacitor connected between said voltage supply circuit and a ground potential.

4. The power amplifier according to claim 1, wherein said first bipolar transistor and said variable impedance element are formed on a semiconductor substrate.

5. The power amplifier according to claim 1, wherein said first bipolar transistor operates in a Class B or Class AB mode.

6. The power amplifier according to claim 1, wherein gain control is carried out by controlling an output voltage of said voltage supply circuit.

7. The power amplifier according to claim 1, wherein a distortion compensation amount of said distortion compensation circuit is controlled by controlling an output voltage of said voltage supply circuit.

8. A power amplifier, comprising:
   a power amplification element including a first bipolar transistor of a common-emitter type;
   a voltage supply circuit for supplying a base of said first bipolar transistor with a bias voltage; and
   a distortion compensation circuit for compensating for distortion of said power amplification element,
   said distortion compensation circuit including:
      a variable impedance element provided between said voltage supply circuit and the base of said first bipolar transistor, and
      an adjustment circuit which compensates for said distortion of said power amplification element by adjusting a value of at least one of a reactance component and a resistance component,
   wherein said adjustment circuit includes:
      a resistor having one terminal connected to said voltage supply circuit, and
      a capacitor connected between another terminal of said resistor and ground potential, and
   wherein said variable impedance element is formed of a diode element having an anode connected to said voltage supply circuit and a cathode connected to the base of said first bipolar transistor.

9. A communication device, comprising:
   a power amplifier having a power amplification element including a first bipolar transistor of a common-emitter type for signal amplification, and a distortion compensation circuit for compensating for distortion of said power amplification element; and
   a voltage supply circuit for supplying a base of said first bipolar transistor with a bias voltage,
   said distortion compensation circuit including:
      a variable impedance element provided between said voltage supply circuit and the base of said first bipolar transistor, and
      an adjustment circuit which compensates for said distortion of said power amplification element by adjusting a value of at least one of a reactance component and a resistance component,
   wherein said variable impedance element is formed of a second bipolar transistor having an emitter connected to the base of said first bipolar transistor, a base connected to said voltage supply circuit, and a collector connected to a node for connecting said adjustment circuit.

10. The communication device according to claim 9, wherein said adjustment circuit includes
   a resistor having one terminal connected to said voltage supply circuit, and
   a capacitor connected between another terminal of said resistor and a ground potential.

11. The communication device according to claim 9, wherein said adjustment circuit includes:
   a resistor having one terminal connected to said voltage supply circuit and another terminal connected to said variable impedance element, and
   a capacitor connected between said voltage supply circuit and a ground potential.

12. The communication device according to claim 9, wherein said first bipolar transistor and said variable impedance element are formed on a semiconductor substrate.

13. The communication device according to claim 9, wherein said first bipolar transistor operates in a Class B or Class AB mode.

14. The communication device according to claim 9, wherein a gain of said power amplifier is controlled by controlling an output voltage of said voltage supply circuit.

15. The communication device according to claim 9, wherein a distortion compensation amount of said distortion compensation circuit is controlled by controlling an output voltage of said voltage supply circuit.

16. The communication device according to claim 9, wherein said signal includes an amplitude modulation component.

17. The communication device according to claim 9, further comprising:
   a detection circuit for detecting a signal power level input to said power amplifier or a signal power level output from said power amplifier; and
   a control circuit for controlling an output voltage of said voltage supply circuit according to said signal power level detected by said detection circuit.

18. A communication device, comprising:
   a power amplifier having a power amplification element including a first bipolar transistor of a common-emitter type for signal amplification, and a distortion compensation circuit for compensating for distortion of said power amplification element; and
   a voltage supply circuit for supplying a base of said first bipolar transistor with a bias voltage,
   said distortion compensation circuit including:
      a variable impedance element provided between said voltage supply circuit and the base of said first bipolar transistor, and
      an adjustment circuit which compensates for said distortion of said power amplification element by adjusting a value of at least one of a reactance component and a resistance component,
   wherein said adjustment circuit includes:
      a resistor having one terminal connected to said voltage supply circuit, and
      a capacitor connected between another terminal of said resistor and ground p potential, and
   wherein said variable impedance element is formed of a diode element having an anode connected to said voltage supply circuit and a cathode connected to the base of said first bipolar transistor.

19. A power amplifier, comprising:
   a power amplification element including a first bipolar transistor of a common-emitter type;
   a voltage supply circuit for supplying a base of said first bipolar transistor with a bias voltage; and
   a distortion compensation circuit provided between said voltage supply circuit and the base of said first bipolar transistor for compensating for distortion of said power amplification element;
   said distortion compensation circuit including:
      a variable impedance element provided between said voltage supply circuit and the base of said first bipolar transistor; and
      an adjustment circuit which compensates for said distortion of said power amplification element by adjusting a value of at least one of a reactance component and a resistance component,
   wherein said variable impedance element is formed of a diode element having an anode connected to said voltage supply circuit and a cathode connected to the base of said first bipolar transistor.

* * * * *